United States Patent
You et al.

(10) Patent No.: US 7,550,068 B2
(45) Date of Patent: *Jun. 23, 2009

(54) WIRELESS ELECTROLYTIC CELL MONITORING POWERED BY ULTRA LOW BUS VOLTAGE

(75) Inventors: Eugene Yanjun You, Salt Lake City, UT (US); Antonio Berges-Dreyfous, Papua (ID); David B. George, Salt Lake City, UT (US); Roger Roth, Salt Lake City, UT (US); Keming Zhou, Salt Lake City, UT (US); Minyan Ruan, Salt Lake City, UT (US)

(73) Assignee: Kennecott Utah Copper Corporation, Magna, UT (US)

( * ) Notice: Subject to any disclaimer, the term of this patent is extended or adjusted under 35 U.S.C. 154(b) by 427 days.

This patent is subject to a terminal disclaimer.

(21) Appl. No.: 11/082,685

(22) Filed: Mar. 17, 2005

(65) Prior Publication Data
US 2005/0217999 A1 Oct. 6, 2005

Related U.S. Application Data

(60) Provisional application No. 60/553,899, filed on Mar. 17, 2004.

(51) Int. Cl.
*C25B 9/04* (2006.01)
*C25B 15/02* (2006.01)

(52) U.S. Cl. .............. 204/229.8; 204/230.2; 204/228.6; 204/228.1; 204/228.2; 204/228.3; 204/228.4; 205/574

(58) Field of Classification Search .............. 204/278.5, 204/242, 267, 269, 270, 229.8, 230.2, 228.6, 204/228.1–228.4, 232, 224 R; 205/574
See application file for complete search history.

(56) References Cited

U.S. PATENT DOCUMENTS

| | | | |
|---|---|---|---|
| 3,793,166 A | 2/1974 | Shaw | |
| 3,926,750 A | 12/1975 | Adachi et al. | |
| 3,987,351 A | 10/1976 | Appelberg et al. | .......... 318/591 |

(Continued)

FOREIGN PATENT DOCUMENTS

| EP | 0597404 A2 | 5/1994 |
|---|---|---|
| GB | 2254416 A | 10/1992 |

OTHER PUBLICATIONS

Marcy, Henry O. et al, *Wireless Sensor Networks for Area Monitoring and Integrated Vehicle Health Management Applications*, Rockwell Science Center, Thousand Oaks, CA, pp. 1-11, 1999.

(Continued)

*Primary Examiner*—Bruce F Bell
(74) *Attorney, Agent, or Firm*—Whyte Hirschboeck Dudek SC

(57) ABSTRACT

A system, device, and method include a cell-powered first electronic device powered using electrical potential imposed across an electrolytic cell. The potential is voltage-boosted to accomplish this task. If the electrical potential imposed the cell is insufficient, the device can also be battery-powered. In any event, this device is in communication with one or more sensors in the electrolytic cell, as well as a second electronic device, and the first and second electronic devices wirelessly communicate. More specifically, the first electronic device wireless transmits data signals to the second electronic device, which receives the same. The first and second electronic devices are physically remote from one another, and they communicating over a private or public network, preferably using spread spectrum technology. In addition, the second electronic device also preferably transmits data signals to a computer for further processing of the data signals, and these arrangements can be used, for example, when producing copper.

20 Claims, 12 Drawing Sheets

U.S. PATENT DOCUMENTS

| | | | |
|---|---|---|---|
| 4,035,251 A | 7/1977 | Shiver et al. | 204/67 |
| 4,038,162 A | 7/1977 | Kapanen et al. | 204/105 R |
| 4,281,290 A | 7/1981 | Peacey et al. | 324/426 |
| 4,351,705 A * | 9/1982 | Ernst et al. | 205/345 |
| 4,461,989 A | 7/1984 | Dotson et al. | 323/222 |
| 4,514,648 A | 4/1985 | Dotson et al. | 307/350 |
| 4,786,379 A | 11/1988 | Barnett | 204/67 |
| 5,250,903 A | 10/1993 | Limuti et al. | |
| 5,404,329 A | 4/1995 | Yamagata et al. | 365/189.09 |
| 5,435,897 A | 7/1995 | Zannini | 204/245 |
| 5,526,253 A | 6/1996 | Duley | 363/59 |
| 5,592,115 A | 1/1997 | Kassapian | 327/239 |
| 5,636,115 A | 6/1997 | Drouot | 363/60 |
| 5,687,091 A | 11/1997 | Maung et al. | 364/499 |
| 5,768,115 A | 6/1998 | Pascucci et al. | 363/59 |
| 5,832,411 A | 11/1998 | Schatzmann et al. | 702/23 |
| 5,854,568 A | 12/1998 | Moscaluk | 327/537 |
| 5,880,628 A | 3/1999 | Criscione et al. | 327/589 |
| 5,999,107 A | 12/1999 | Cooper et al. | |
| 6,136,177 A | 10/2000 | Hung | 205/336 |
| 6,140,820 A | 10/2000 | James | 324/434 |
| 6,231,641 B1 | 5/2001 | Utigard et al. | 75/640 |
| 6,278,318 B1 | 8/2001 | Watanabe | 327/536 |
| 6,281,684 B1 | 8/2001 | James | 324/434 |
| 6,356,137 B1 | 3/2002 | Roohparvar et al. | 327/390 |
| 6,503,648 B1 * | 1/2003 | Wang | 429/21 |
| 6,507,237 B2 | 1/2003 | Hsu et al. | 327/538 |
| 6,592,736 B2 | 7/2003 | Fulton et al. | 205/81 |
| 6,833,205 B2 * | 12/2004 | Speranza et al. | 429/13 |
| 2002/0160363 A1 | 10/2002 | McDevitt et al. | |
| 2003/0066759 A1 | 4/2003 | Hardee et al. | 205/565 |
| 2003/0085179 A1 | 5/2003 | Kim et al. | 210/739 |
| 2003/0144581 A1 * | 7/2003 | Conn et al. | 600/309 |
| 2003/0146744 A1 | 8/2003 | Hauenstein et al. | |
| 2004/0211663 A1 | 10/2004 | Gagne et al. | |
| 2005/0023151 A1 * | 2/2005 | Sandoval et al. | 205/574 |
| 2006/0114642 A1 | 6/2006 | Liu et al. | |
| 2006/0115693 A1 * | 6/2006 | Toth et al. | 429/13 |
| 2006/0213766 A1 * | 9/2006 | You | 204/228.1 |

OTHER PUBLICATIONS

Chen, Steven et al., *IEEE 1451 Smart Wireless Machinery Monitoring and Control for Naval Vessels*, presented at the Thirteenth International Ship Control Systems Symposium (SCSS) in Orlando, Florida, Apr. 2003.

Maresca, Patrick, *Linear Circuit Devices for Applications in Battery Powered Wireless Systems*, Microchip Technology, Inc., pp. 1-8, 2003.

Lee, Jr., Lloyd Dewey, *Remote Machinery Condition Monitoring Using Wireless Technology and the Internet*, MAARS Inc., reprinted from http://www.reliabilityweb.com.

Tang, Yonghui et al., *A 0.6V Ultra Low Voltage Operational Amplifier*, Department of Electrical and Computer Engineering Iowa State University, Ames, IA.

Nippon Telegraph and Telephone Corporation and NTT Advanced Technology Corporation, Press Release, *Launch of "Pocket Energy" in May 2004—A Prototype Versatile, Environmentally Friendly Solar-Powered Mobile Power Source for Portable Devices such as Mobile Phones, PDAs, and Digital Cameras—*, Feb. 13, 2004, http://www.ntt.co.jp/news/news04e/0402/040213.html.

Christlo, A., *Computerised Cell Voltage Monitoring at the Electrolytic Refining and Smelting Company of Australia Limited*, Port Kembla, NSW, Australia, Electrorefining and Winning of Copper: Proceedings of the Symposium, pp. 311-331, 1987.

Hoey, D.W., et al., *Modern Tank House Design and Practices at Copper Refineries Pty. Ltd.*, Electrorefining and Winning of Copper: Proceedings of the Symposium, pp. 271-293, 1987.

O'Kane, John et al., *Role of Computerised Cell Voltage Monitoring in Copper Electrolytic Refining at Copper Refineries Pty. Ltd.*, Townsville, Australia, Application of Polarization Measurements in the Control of Metal Deposition, pp. 270-284, 1984.

Biswas, et al., Extractive Metallurgy of Copper, 3rd Edition, 1994, pp. 324-357.

* cited by examiner

PRIOR ART

WIRELESS ELECTROLYTIC CELL MONITORING POWERED BY ULTRA LOW BUS VOLTAGE

CROSS-REFERENCE TO RELATED APPLICATIONS

This application claims priority under 35 U.S.C. § 119(e) to Provisional Patent Application Ser. No. 60/553,899, filed on Mar. 17, 2004, the entire disclosure of which is hereby incorporated by reference.

BACKGROUND OF THE INVENTION

1. Field of the Invention

This invention relates to electrolytic cell monitoring for electrometallurgical systems, including, for example, i) electrorefining and electrowinning systems for copper, zinc, nickel, lead, cobalt, and other like metals, ii) electrochemical cells, such as chlor-alkali systems, and iii) molten salt electrolysis, such as aluminum and magnesium electrolysis.

Insofar as the inventive arrangements can be used with electrolytic cell monitoring during a copper refinement stage of producing copper, copper production will be described hereinout for exemplary, representative, and non-limiting purposes.

2. Description of Related Art

Producing copper involves a series of steps involving mining, crushing and grinding, concentrating, smelting, converting, and refining procedures, each of which is well-known, shown in block diagram format in FIG. 1, and elaborated upon below. As depicted, mining 10 loosens and collects ore. Crushing and grinding 12 turn the ore into a crushed and ground ore, comprising a fine powder in which desired ore minerals are liberated. Concentration 14 collects the desired ore minerals into a watery slurry, which is then filtered and dried to produce a liquid concentrate suitable for smelting. Smelting 16 smelts (i.e., melts and oxidizes) iron and sulfur in the liquid concentrate to produce a copper matte. Conversion 18 converts the copper matte by oxidation into a blister copper. And finally, refinement 20 refines the blister copper into a more refined copper.

Referring now to FIG. 1, more specific descriptions will now be provided for further exemplary, representative, and non-limiting purposes:

A. Mining 10

As known, large amounts of ore containing various minerals exist beneath the surface of the Earth, comprising one or more of a copper sulfide or copper-iron-sulfide mineral, such as chalcocite, chalcopyrite, and bornite. Holes are drilled into this ore so that explosives can be detonated to loosen the ore and make it amenable to loading and hauling to a crushing and grinding facility.

B. Crushing and Grinding 12

At the crushing and grinding facility, the ore is crushed, mixed with water, and ground into a fine powder by various ore crushing and grinding mechanisms, after which it is pumped to a concentration facility. Crushed and ground ore typically contains less than 2 weight percent ("wt %") copper.

C. Concentration 14

At the concentration facility, the crushed and ground ore is concentrated into a slurry liquid concentrate. More specifically, the crushed and ground ore is mixed with water, chemicals, and air in a floatation cell, which causes copper in the crushed and ground ore to stick to air bubbles rising within the flotation cell. As the air bubbles float to the top of the surface of the flotation cell, they are collected to form the liquid concentrate.

Thus, concentration 14 concentrates the crushed and ground ore into slurry liquid concentrate, which typically contains approximately 25-35 wt % copper (and 20-30 wt % water). Using various filters, the concentrate is then dewatered to produce a moist copper concentrate that is amenable to handling by conveyor belts, loaders, rail cars, and the like.

D. Smelting 16

Using heat and oxygen, the concentrate is smelted into a slag and copper-iron sulfide called copper matte. More specifically, the moist concentrate is first dried in a large, rotating drum or similar drying apparatus. Then, it is fed into a smelting process in which the now-dried concentrate is mixed with oxygen-enriched air and blown into a smelting furnace through a concentrate burner. Within the smelting furnace, the now-dried concentrate is exposed to temperatures greater than 2300° Fahrenheit, by which it partially oxidizes and melts due to heat generated by oxidizing sulfur and iron within the molten concentrate.

This process generates the following three products: i) off-gases, ii) slag, and iii) copper matte. The off-gases, which include sulfur dioxide (i.e., $SO_2$), are routed to a waste gas handling system through an off-take riser in the smelting furnace. The slag comprises silica and iron, or more specifically, gangue mineral, flux, and iron oxides, and it has a low specific gravity (i.e., lower density) relative to the copper matte, thus allowing it to float on top of the copper matte. The copper matte, on the other hand, comprises copper sulfide and iron sulfide, and it has a high specific gravity (i.e., higher density) relative to the slag, thus allowing it to form, collect, and sink to a basin or settler located at the bottom of the smelting furnace.

Periodically, the slag is tapped off. More specifically, the slag and copper matte are conventionally separated by skimming the slag from the copper matte through various tap-holes in sidewalls of the smelting furnace. These tap-holes are commonly located at a relatively high elevation on the sidewalls to allow the slag to be removed from the smelting furnace without removing the copper matte. Conversely, various tap-holes for the copper matte are commonly located at a relatively low elevation on the sidewalls to allow the copper matte to be removed from the smelting furnace without removing the slag.

Thus, smelting 16 smelts the liquid concentrate into copper matte, which typically contains approximately 35-75 wt % copper.

E. Conversion 18

After the slag is separated from the copper matte, the copper matte can be i) transferred directly into a conversion furnace, ii) transferred into a holding furnace for subsequent delivery to the conversion furnace, or iii) converted into a solid form by flash-cooling the copper matte in water to form granules, which are stock-piled in a large, enclosed space for subsequent delivery to the conversion furnace. Within the conversion furnace, various remaining impurities are removed from the copper matte, and the result produces a molten copper called blister copper.

There are two basic types of conversion furnaces—namely, flash conversion furnaces and bath conversion furnaces. The purpose of each is to oxidize (i.e., convert) metal sulfides to metal oxides. Representative flash conversion furnaces, which are also known as suspension furnaces, include the flash conversion furnace used by Kennecott Utah Copper Corp. at its Magna, Utah facility. Representative bath conversion furnaces include the bath conversion furnaces used by i) Noranda, Inc. at its Home, Canada facility; ii) Inco Ltd. at its Sudbury, Canada facility; and iii) Mitsubishi Materials Corp. at its Naoshima, Japan facility.

Regardless of the type of conversion furnace, the copper matte is converted into blister copper within the conversion furnace by the reaction of the copper matte with oxygen. More specifically, in bath conversion furnaces, the molten copper matte is charged into the furnace and air or oxygen-enriched air is blown into the molten copper matte through tuyeres or gas injectors. Silica flux is added to the bath conversion furnace to combine with the iron being oxidized and form the slag.

Flash conversion processes, on the other hand, treat solidified copper matte by first grinding the matte to a suitable size (i.e., a powder) and then blowing this into a flash reaction furnace using oxygen enriched air (ca. 70-90% oxygen). Flux is also added to the powdered matte, typically as calcium oxide, but it may also be silica or a combination of calcium oxide and silica. The powdered matte combusts in the oxygen atmosphere and generates sufficient heat to melt the materials and flux and produce molten blister and slag.

These conversion processes generate the following two products: i) slag and ii) blister copper. The slag comprises gangue mineral, copper metal (i.e., $Cu^0$), copper oxides (principally in the form of $Cu_2O$), flux, and iron oxides, and it has a low specific gravity (i.e., lower density) relative to the blister copper, thus allowing it to float on top of the blister copper. The blister copper, on the other hand, comprises gangue mineral, copper metal (i.e., $Cu^0$), copper oxides (principally in the form of $Cu_2O$), and copper sulfides (principally in the form of $Cu_2S$), and it has a high specific gravity (i.e., higher density) relative to the slag, thus allowing it to form, collect, and sink to a basin or settler located at the bottom of the conversion furnace. While the top slag layer is typically approximately thirty centimeters deep, the bottom blister copper layer is approximately fifty centimeters deep.

If the conversion furnace is a rotary bath conversion furnace, then the slag and blister copper are separately poured from a mouth or spout on an intermittent basis. If, on the other hand, the conversion furnace is stationary bath conversion furnace, then outlets are provided for removing the slag and blister copper. These outlets typically include various tap-holes that are located at varying elevations on one or more sidewalls of the conversion furnace, and, in a manner similar to that used with the smelting furnace, each is removed from the conversion furnace independently of the other. Other types of conversion furnaces commonly utilize one or more outlets to continuously overflow the slag and blister copper, using, for example, an appropriate weir to retain the slag.

The phase separation that occurs between the slag and blister copper is not complete. Thus, the slag, as indicated, contains additional copper, which is usually in the form of copper metal (i.e., $Cu^0$) and copper oxides (principally in the form of $Cu_2O$), while the blister copper contains various waste and un-recovered minerals (e.g., sulfur), which are principally in the form of copper oxides (principally in the form of $Cu_2O$), copper sulfides (principally in the form of $Cu_2S$), and ferrosilicates, etc. The copper that is in the slag has a lost metal value, which can be recovered by recycling the slag back to the smelting furnace, while the waste and un-recovered mineral values in the blister copper constitute impurities that are eventually removed in either an anode furnace or through electrorefining.

Thus, conversion 18 converts the copper matte into blister copper, which typically contains more than 98 wt % copper.

F. Refinement 20

Finally, the blister copper is refined, usually first pyrometallurgically and then electrolytically. More specifically, the blister copper is subjected to an additional purification step to further up-grade the copper content, such as fire refining in a reverberatory or rotary anode furnace. Then, the blister copper is cast into large, thick plates called anodes, which are often transferred from an anode casting plant to the electrolytic copper refinery by truck, rail, or the like. In the electrolytic copper refinery, the anodes are lowered into an acidic solution that contains approximately 120-250 gpl of free sulfuric acid and approximately 30-50 gpl of dissolved copper. The anodes are also electrically connected to a positive direct current supply. To electrolyze the anodes in this aqueous electrolyte, they are separated by insoluble, interleaved stainless steel blanks called starter sheets or cathodes, which are negatively charged. Electricity is then sent between the anodes and cathodes for a pre-determined length of time, causing copper ions to migrate from the anodes to the cathodes to form plates at the cathodes, which contain less than 20 parts per million impurities (i.e., sulfur plus non-copper metals, but not including oxygen). Voltages of approximately 0.1-0.5 volts are generally sufficient to dissolve the anodes and deposit the copper on the cathodes, with corresponding current densities of approximately 160-380 amps/m$^2$. With each anode producing two cathode plates at which the refined copper is deposited, the cathode plates are then washed and ready for an ultimate end use.

In a typical copper refinery producing 300,000 tons of copper cathode per year, there can be as many as 1,440 electrolytic cells, each with 46 anodes and 45 cathode blanks, for a total of 131,000 pieces suspended into the cells. In such a traditional copper refinery, each cathode and each anode is electrically connected to the refinery current supply system through two or more contact points on the supporting ears of the anodes and the hanger bars of the cathodes. This means there can be a total of over 260,000 electrical connections (i.e., two per anode and two per cathode multiplied by the number of cathodes and anodes). Critical to the efficient operation of the refining process is the absence of short circuits between the anodes and cathode blanks. As subsequently elaborated upon, short circuits can occur if the anodes and cathodes are mis-aligned or if copper deposits on the cathode grow in a non uniform manner and contact the anode. When short circuits do occur, the desired copper plating process is disrupted and the efficiency of electrical use decreases. Accordingly, the short circuits result in decreasing the voltage differential across the anodes and cathodes.

Critical to the efficient operation of the refining process is the absence of open and short circuits between the anodes and cathodes. As subsequently elaborated upon, short circuits can occur if the anodes and cathodes are mis-aligned or if copper deposits on the cathode grow in a non-uniform manner and contact the anode. When short circuits do occur, the desired copper plating process is disrupted. Open circuits, on the other hand, can occur if there is poor contact between the current supply and the anodes or cathodes. When open circuits do occur, the efficiency of electrical use decreases.

Thus, refinement 20 refines the blister copper into refined copper, which typically contains approximately 99.99 wt % copper (i.e., effectively, pure copper).

Thereafter, refinement 20 allows the refined cathode copper to be converted into any number of copper end-products using conventional methods and techniques, which are well-known in the art.

The efficiency of copper refinement 20 can be increased by increasing the efficiency of cell monitoring. More specifically, at least two important cell parameters need to be closely monitored—namely, cell voltage and cell temperature. Failure to adequately monitor these two cell parameter, and others, can reduce metal recovery, increase scrap rate, and lead to inefficient energy utilization. Nevertheless, most electrolytic metal recovery and refining facilities do not effectively monitor these cell parameters, primarily due to high capital and operating costs associated with such cell monitoring. For example, these costs are significantly high when each individual electrolytic cell in a tank house is hardwired to parameter monitoring and transmission equipment. Doing so generally requires a significant amount of hardwiring in an environment that is inherently hostile, inherently corrosive, and inherently subject to large magnetic fields. In particular, while the voltage differential across any cell is on the order of 0.1 to 0.5 volts, the voltage differential across the entire tank house can be several hundred volts. It is inherently unsafe to simply connect wires to the individual cells and route these to voltage monitoring equipment because the voltage potential can be potentially fatal. Because presently existing cell monitoring equipment and technologies are expensive and require extensive hard wiring, both shortcomings have significantly deterred widespread market penetration of effective electrolytic cell monitoring.

As a result, open and short circuits commonly occur during the electrolytic refining of copper. They occur for many reasons, including i) poor anode and cathode physical qualities, ii) poor contact between the current supply and the anodes or cathodes, iii) misalignment of anodes and cathodes, and iv) localized variations in electrolyte temperature, additive levels, or chemistry. Thus, efficient electrolytic cell monitoring is important during the electrolytic refining of copper, as it can enable system operators to detect open and short circuits between anodes and cathodes, which, if not cleared, reduce current efficiencies and result in down-stream processing problems, such as poor cathode development. As known, copper impurity, copper content, and copper appearance are also ultimately adversely affected by open and short circuits.

Conventional monitoring focused on only identifying short circuits between the anodes and cathodes. This was commonly accomplished by manually using a hand-held Gauss meter to detect abnormal magnetic fields flowing through the cathode. Such a procedure generally required physically walking over the anodes and cathodes in each cell while closely observing the hand-held Gauss meter to detect a large deflection in a meter needle. Oftentimes, the Gauss meter was affixed to a distal end of a long stick or pole, whereby it can then be held close to the cathode hanger bar. Regardless, the task was both ergonomically difficult and accident-prone. Moreover, walking on the cells frequently misaligned the anode and cathodes, could lead to possible contamination, and often lead to further problems as well.

While detecting open and short circuits deals with their effects rather than their causes, it is a widely recognized technique for improving electrode quality. Accordingly, after a short circuit is detected, it is generally cleared by probing between the cathode and anode with a stainless steel rod to locate the fault and then physically separating (i.e., breaking off) an errant copper nodule growing at the epicenter of the short circuit. This often requires physically lifting the cathode out of the cell. Unfortunately, however, many open and short circuits are not often detected until after significant damage has already occurred.

Consequently, there is a need for less expensive, less intrusive, lower maintenance, and higher efficiency electrolytic cell monitoring systems and methods. Such systems and methods would increase energy utilization and efficiency during the copper refinement stage 20 of producing copper. Thus, a need exists for a cost effective, minimally intrusive, minimal maintenance, and increasingly efficient electrolytic cell monitoring systems and methods for measuring electrolytic cell parameters such as anode and cathode voltages and temperatures during the copper refinement stage 20 of producing copper.

SUMMARY OF THE INVENTION

In one embodiment, the inventive arrangements provide a system comprising a cell-powered first electronic device that is powered using electrical potential imposed across an electrolytic cell, in which the electrical potential is voltage-boosted to accomplish this task. If the electrical potential imposed the cell is insufficient to power this device, it can also be battery-powered. In any event, this device is in communication with one or more sensors in the electrolytic cell, as well as a second electronic device, and the first and second electronic devices wirelessly communicate. More specifically, the second electronic device receives data signals from the first electronic device, the first electronic device transmitting the data signals thereto, the first and second electronic devices preferably being physically remote from one another and communicating over a private or public network, preferably using spread spectrum technology. In addition, the second electronic device also preferably transmits data signals to a computer for further processing of the data signals.

In another embodiment, the inventive arrangements also provide an electrolytic cell monitoring device comprising an electronic component in communication with sensors in an electrolytic cell, the component being powered using electrical potential imposed across the cell, in which the potential is often voltage-boosted to accomplish this task. If the electrical potential imposed the cell is insufficient to power this device, it can also be battery-powered.

In another embodiment, the inventive arrangements also provide a method for monitoring an electrolytic cell, comprising providing a cell-powered first electronic device that is powered using electrical potential imposed across the cell, in which the method voltage-boosts the potential to accomplish this task. If the electrical potential imposed the cell is insufficient to power this device, the method can also power the device using a battery. In any event, this device is in communication with one or more sensors in the electrolytic cell, as well as a second electronic device, and the first and second electronic devices wirelessly communicate. More specifically, the method wirelessly transmits data signals from the first electronic device to the second electronic device, the first and second electronic devices preferably being physically remote from one another and communicating over a private or public network, preferably using spread spectrum technology.

In another embodiment, the inventive arrangements also provide a method for producing high-purity copper comprising sampling sensors that monitor electrolytic cell parameters that correspond to physical properties of the cell to generate data signals, and then wirelessly transmitting the data signals to a remote electronic device.

BRIEF DESCRIPTION OF THE SEVERAL VIEWS OF THE DRAWINGS

A clear conception of the advantages and features constituting inventive arrangements, and of various construction and operational aspects of typical mechanisms provided therewith, will become readily apparent by referring to the following exemplary, representative, and non-limiting illustrations, which form an integral part of this specification, wherein like reference numerals generally designate the same elements in the several views, and in which.

DETAILED DESCRIPTION OF PREFERRED EMBODIMENTS

Figure 1:
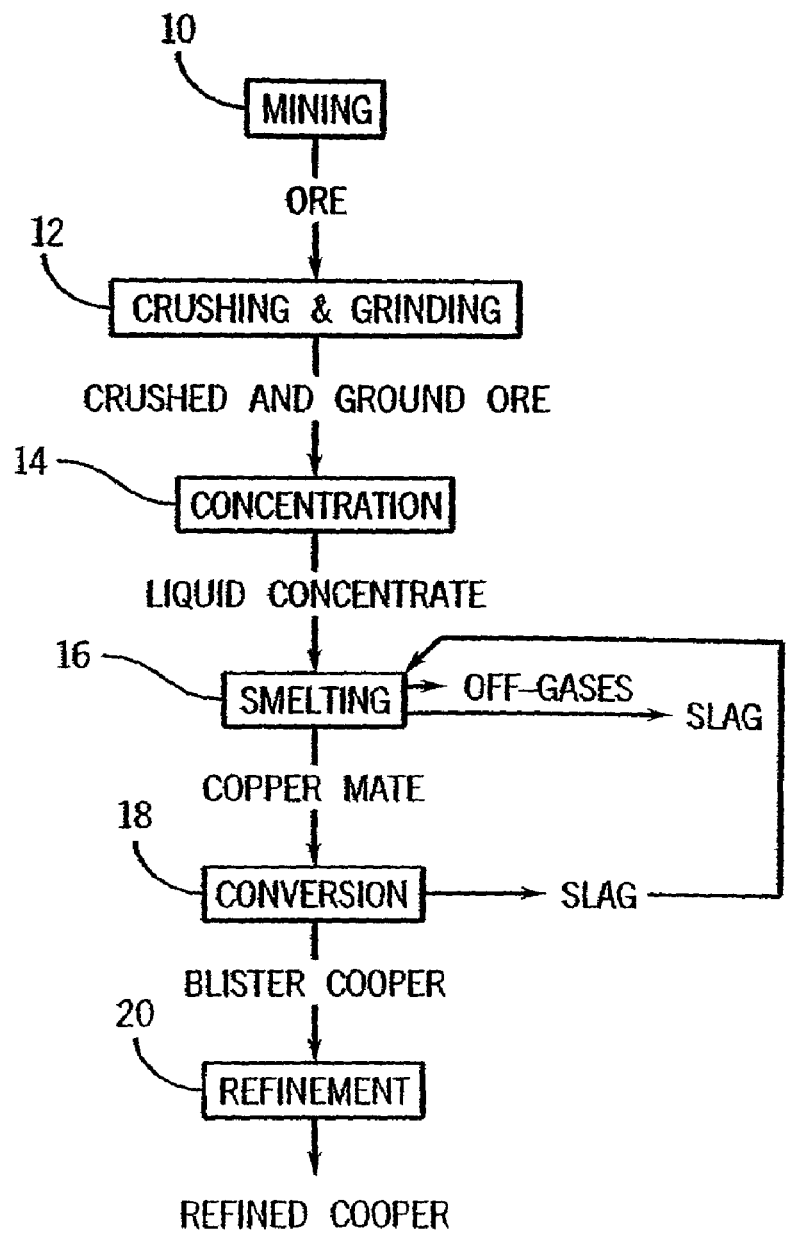
FIG. 1 is a prior art flow chart of electrometallurgical copper production.
Figure 2:
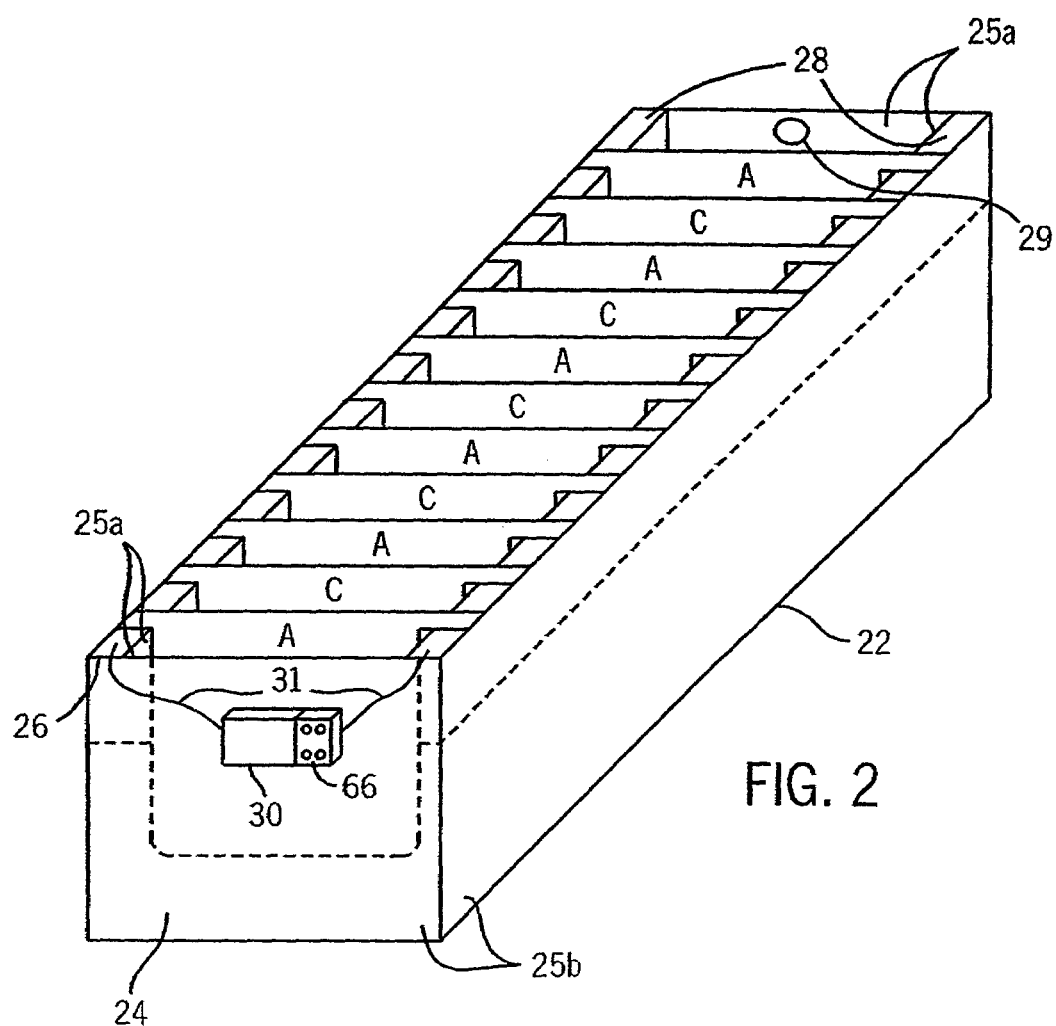
FIG. 2 is a perspective view of a slave affixed to a representative electrolytic cell.

Referring now to FIG. 2, an electrolytic cell 22 is shown, in which anode plates (i.e., "anodes") A and cathode sheets (i.e., "cathodes") C are alternately arranged close to one another and immersed in an aqueous electrolyte 24 contained within internal walls 25a of the electrolytic cell 22. During copper production, the aqueous electrolyte 24 is normally filled relatively close to a top surface 26 of the electrolytic cell 22, although a lesser amount is shown in the figure for clarity. Within the electrolytic cell 22, the anodes A and cathodes C are in ear-contact with current rails 28 running lengthwise on the top surface 26 of the electrolytic cell 22. The current rails 28 carry electrical current to the electrolytic cell 22 to assist in copper ion migration from the anodes A to the cathodes C. Although the electrolytic cell 22 is generally at an ultra-low voltage (i.e., 0.1-0.8 volts), 25,000 amperes of current is not uncommon about the electrolytic cell 22. This cell voltage is typically powered by a bus voltage, which is the voltage impressed across the anodes A and cathodes C for the ion migration.

A common copper-producing tank house contains as many as forty (40) sections, each of which contains thirty-six (36) electrolytic cells 22. Moreover, a typical electrolytic cell 22 contains as many as forty-six (46) anode-cathode A-C pairs and can often yield as many as 1440 cells in a common tank house, or in excess of 66,240 anode-cathode A-C pairs. Since short circuits can occur between any of the anode-cathode A-C pairs at any time, constant electrolytic cell monitoring is greatly beneficial to increasing copper production. However, the need to provide electrical power to an electrolytic cell monitor at each and every electrolytic cell 22 quickly becomes burdensome. As a result, since hard-wired monitoring system are difficult and expensive to install and maintain, it is estimated that less than 60% of the world's refineries currently monitor cell production, despite the advantages that can be obtained by doing so, as previously elaborated upon.

Accordingly, a cell-powered microprocessor-based slave 30 is electrically attached to the electrolytic cell 22, with electrical connections 31 connecting the slave 30 to the current rails 28 of the electrolytic cell 22. Preferably, a suitable mechanical connection also connects the slave 30 to the electrolytic cell 22. For example, in one preferred embodiment, the slave 30 is suspended from a wire form (not shown) depending from the top surface 26 along a suitable external wall 25b of the electrolytic cell 22. In another preferred embodiment, the electrolytic cell 22 is cast with an indentation suited to receive the slave 30. In yet another preferred embodiment, one or multiple slaves 30 straddle adjacent cells 22 that are aligned in close physical proximity to one another. Moreover, if the slave 30 is in close physical contact with the electrolytic cell 22, it is preferably encased in a suitable housing to protect it from the harsh environment to which it is exposed. In any event, techniques and methods of electromechanical attachment are known in the art and not specifically intended as integral components of the general inventive arrangements. Rather, suitable locations and attachment methods are chosen, preferably to maximize wireless (e.g., radio) link strengths and minimize interference with other copper production steps, such as clearing short circuits as operators walk along the top surface 26 of the electrolytic cell 22.

In addition, the slave 30 is also attached to, and in electrical communication with, various sensors (not shown) that monitor cell parameters corresponding to physical properties of the electrolytic cell 22 to which the sensors are attached. For example, representative cell parameters include cell voltage, cell temperature, and cell turbidity. Accordingly, suitable voltage sensors monitor cell voltage. Suitable temperature sensors (e.g., thermometers, thermisters, and the like) monitor cell temperature. And suitable turbidity sensors monitor cell turbidity, often using laser technology. Suitable sensors also provide in-situ monitoring of reagents, specific ion electrode monitoring, and monitoring of the composition of the aqueous electrolyte 24. All of these sensors are in contact and communication with the slave 30.

If one preferred embodiment, multiple cell temperatures are monitored, for example, by providing multiple temperature sensors in the electrolytic cell 22, such as placing one near a drain 29 of the electrolytic cell 22 and another along the one or more internal walls 25a thereof. Accordingly, accurate heat loss or balance from the electrolytic cell 22 can be monitored. For example, a preferred temperature sensor is the DS18B20 1-Wire® high-precision digital thermometer available from Maxim Integrated Products, Inc. of Sunnyvale, Calif. This temperature sensor has a ±0.5° Celsius accuracy over a −10 to +85° Celsius range, reads over a 1-Wire® serial bus in 2's complement format with 12 bits of resolution (i.e., 0.0625° Celsius), does not require field calibration, is parasite powered by its signal line, has a unique, static 64-bit silicon serial number that serves as the bus address for the sensor, and permits multiple DS18B20 sensors to co-exist on the same 1-Wire® bus. Other suitable temperature sensors may also be used.

The one or more cell parameters correspond to one or more physical properties of the electrolytic cell 22 to which the sensors are attached, and the one or more sensors can be integrated components of the slave 30, or, alternatively, added thereto at a subsequent time as component add-on pieces. The preferred slave 30 is thus flexible with regard to the sensors with which it can operate.

Figure 3:
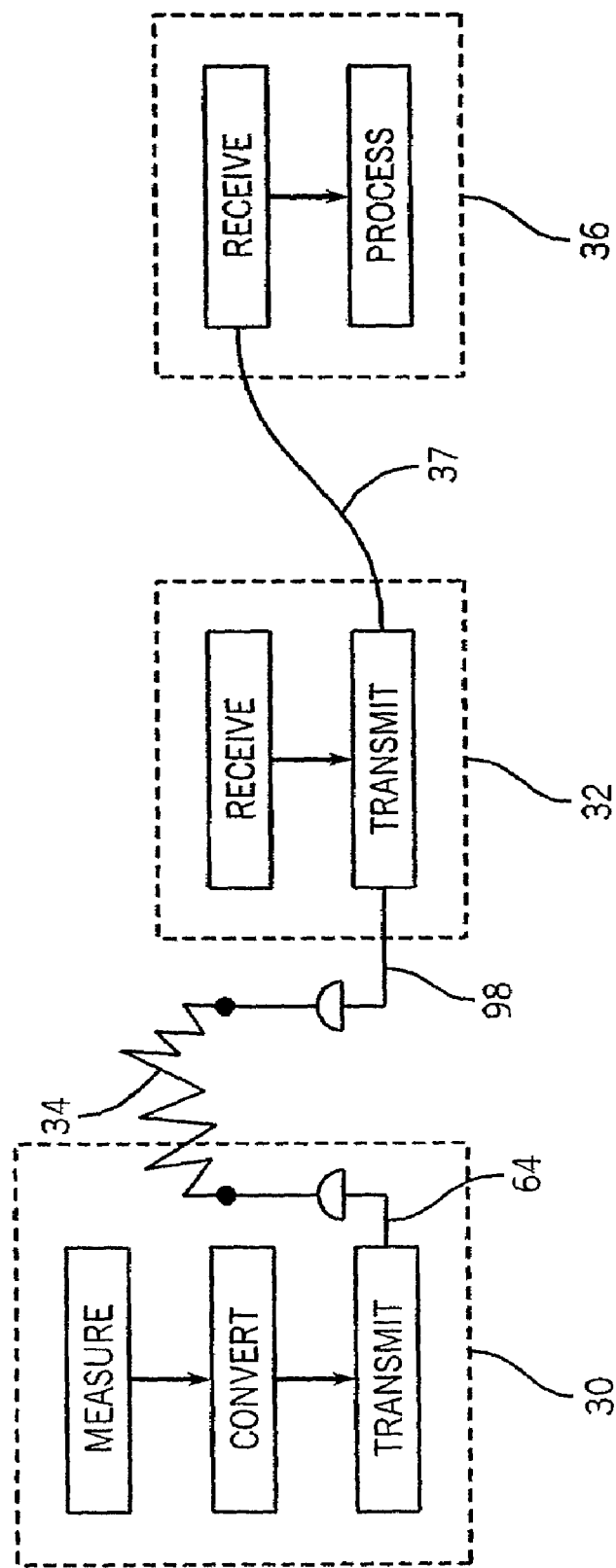
FIG. 3 is a functional diagram of the monitoring system of the present invention, comprising a slave in communication with a master in communication with a computer.

Referring now to FIG. 3, the slave 30 is preferably in electronic communication with one or more masters 32 over a real-time, wireless communications network 34. Preferably, communication between the slaves 30 and masters 32 is two-way, with each device comprising transmitting and receiving capabilities. Any suitable wireless communications network 34 can be employed, including both public and private wireless communications networks 34. For example, IEEE 802.15.4 is commonly used for standard, low-rate, wireless personal area networks.

Preferably, the masters 32 are physically separate and remote from the slaves 30. For example, in a preferred embodiment, the masters 32 are suspended from, or mounted on, a tower, ceiling, or wall in the tank house. In other words, the masters 32 are preferably located outside of the immediate operating area of the electrolytic cells 22 and respective slaves 30. So, while the slaves 30 are preferably electrically and mechanically attached to the electrolytic cells 22, the masters 32 are physically remote therefrom.

In addition, a computer 36 is electronic communication with the masters 32, preferably over a hard-wired, traditional network interface 37, such as connecting the masters 32 to the computer 36 through a RS-232 port, one of its successor RS-422/RS-485 ports, a USB port, or an Ethernet port, all of which are well-known techniques in the art for connecting serial devices. The computer 36 operates as a typical computer or machine readable medium, and it may be implemented as a desktop, laptop, tablet PC, or other appropriate computing platform. Typically, it comprises a system including a processor, but the specific details are not intended as integral components of the general inventive arrangements.

As depicted, the slaves 30 generally accomplish three primary functions: i) measure one or more cell parameters of the electrolytic cells 22; ii) convert cell parameters into one or more data signals (i.e., digital data or digital signals) using traditional analog-to-digital ("A/D") converters; and iii) wirelessly transmit these data signals to the one or more of the masters 32 over the real-time, wireless communications network 34. They may also implement digital signal processing algorithms and self-diagnose information about themselves. Likewise, the masters 32 generally accomplish two primary functions: i) receive these data signals from the one or more slaves 30 over the real-time, wireless communications network 34; and ii) transmit these data signals to the computer 36. And finally, the computer 36 generally accomplishes two primary functions: i) receives data signals from the masters 32 and reports data to a database or data historian that reside on the computer 36 or another computer (not shown) on the plant computer network (not otherwise shown in FIG. 3); and ii) processes and analyzes data and generates diagnostic information about the communication status of the slaves 30 and the masters 32. These wireless communication links in the cell monitoring system are not intended to be unilateral, per se, but also encompass bilateral communications in which transmitter and receiver functionality can be integrated within a single device.

In a large-scale tank house, the masters 32 communicates through one or more data relays 40 and a central master 42, as will be elaborated upon. Multiple central masters 42 can also be implemented if the tank house is sufficiently large or otherwise so requires.

In the preferred embodiment depicted, the slaves 30 wirelessly transmit to the masters 32, which serve as a go-between between the slaves 30 and the computer 36, principally to remove the computer 36 from the tank house and its hostile environment. In another preferred embodiment, however, the slaves 30 wirelessly transmit directly to the computer 36, without transmitting to the masters 32 as a go-between.

Figure 4:
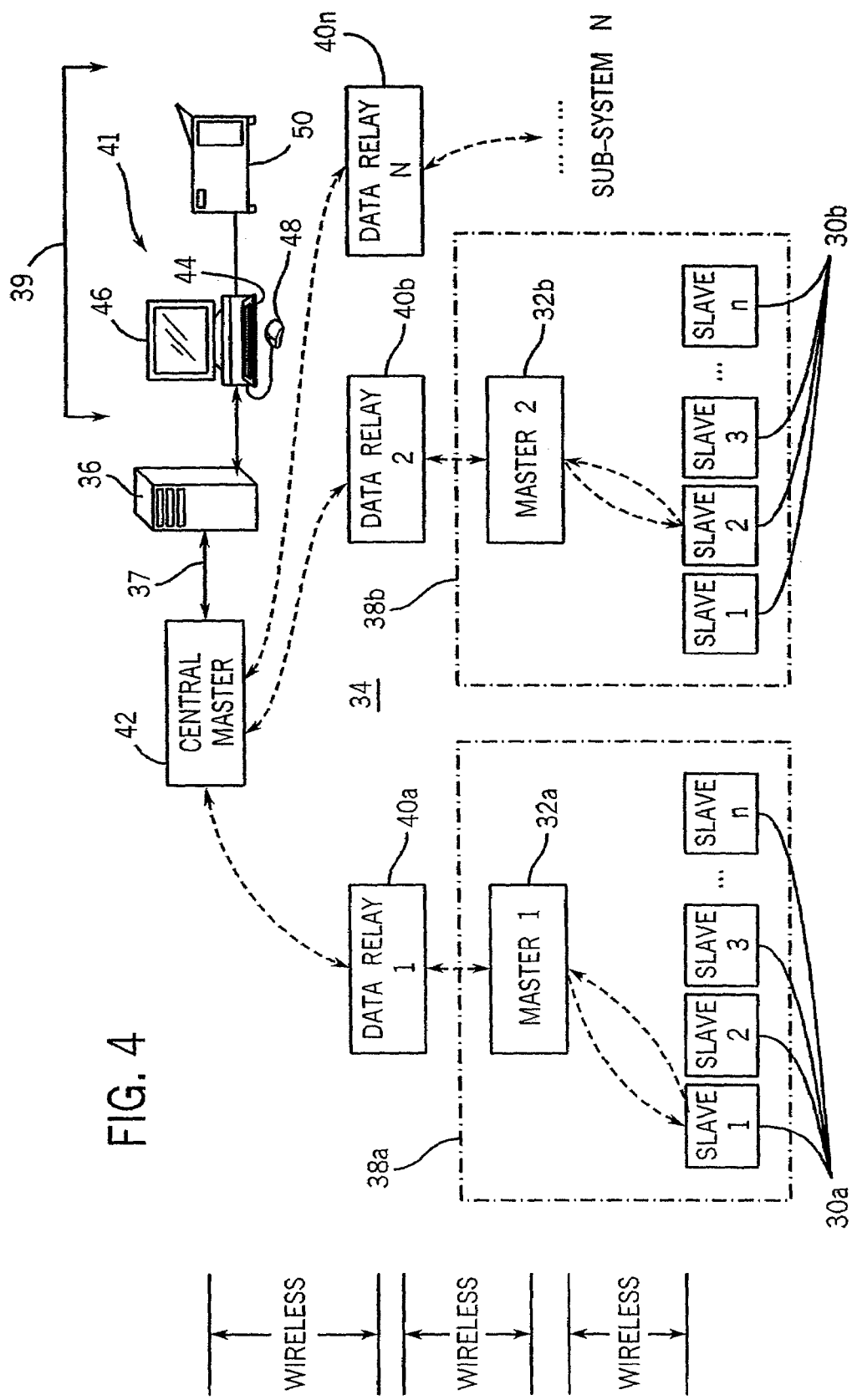
FIG. 4 is an architectural diagram of a representative embodiment of a preferred wireless communications network of the present invention.

Referring now to FIG. 4, a preferred embodiment of the real-time, wireless communications network 34 is shown, in which a first master 32a serves as many as several hundred or so first slaves 30a as part of a first sub-system 38a. Likewise, a second master 32b serves another several hundred or so second slaves 30b as part of a second sub-system 38b, and likewise for an $N^{th}$ master 32n and $N^{th}$ sub-system 38n. As indicated, each master 32 is preferably physically remote from each respective set of slaves 30 and in wireless communication therewith. In a preferred embodiment, it is anticipated that as many as four (4) to eight (8) masters 32 may service the 1440 electrolytic cells 22 spread out over several hectares of the common copper producing tank house. As needed, however, the inventive arrangements are fully scalable, and more or less masters 32 may be provided as necessary. In addition, and as will be described, each master 32 preferably frequency hops, i.e., each master 32 utilizes a frequency hopping system. In other words, these masters 32 preferably utilize different frequency hopping sequences, which enable the multiple masters 32 to co-exist.

In another preferred embodiment, electronic communication between the masters 32 and the computer 36 is further comprised of electronic communications from the masters 32 to data relays 40, from the data relays 40 to a central master 42, and then from the central master 42 to the computer 36, as shown in FIG. 4. More specifically, the first master 32a is in electronic communication with a first data relay 40a, the second master 32b is in electronic communication with a second data relay 40b, and likewise for the $N^{th}$ master 32n in electronic communication with the $N^{th}$ data relay 40n. Preferably, each of the data relays 40 is another slave 30 and communicates between its respective master 32 and the central master 42. Preferably, the central master 42 is another master 32 as well and communicates between its respective data relays 40 and the computer 36. Thus, a reciprocating slave-master-slave-master arrangement preferably exists for transmitting data from the sensors of the electrolytic cell 22 to the computer 36 over the real-time, wireless communications network 34. In a preferred embodiment, each of the slaves 30, masters 32, data relays 40, and central master 42 are formed from the same hardware, thereby facilitating this arrangement. Appropriate software can be implemented on each to accomplish this objective.

Whereas electronic communication between i) the slaves 30 and the masters 32, ii) the masters 32 and the data relays 40, and iii) the data relays 40 and the central master 42 is wireless, communication between the central master 42 and the computer 36 is preferably hardwired over a traditional network interface 37, such as connecting the central master 42 to the computer 36 through the RS-232 port, one of its successor RS-422/RS-485 ports, a USB port, or an Ethernet port, all of which are well-known techniques in the art for connecting serial devices. In any event, the computer 36 eventually processes data signals received from the respective slaves 30.

In a preferred embodiment, the computer 36 normally plays a role as a bridge or data interface between the cell monitoring system (i.e., the slaves 30, masters 32, data relay 40, and central master 42) and an existing plant computer network 39. It reports data to the database or data historian that reside on the computer 36 or another computer (not shown) on the plant computer network 39, which is commonly an Ethernet network., or other plant information system. Because the cell monitoring data is available on the plant computer network 39, one or more computer application workstations 41, with appropriate cell monitoring application software (e.g., CellSense from the Outokumpu Group in Espoo, Finland) installed thereon, can be utilized. The computer application workstation 41 can access cell monitoring data from the data server and compute tank house cell characteristics, such as tank house performance. The results can be presented to an operator in any suitable fashion on any computer (i.e., desktop, laptop, tablet PC, or other appropriate computing platform) on the plant computer network 39. As such, a typical computer application workstations 41 may include a keyboard 44, monitor 46, and mouse 48 for controlling and interacting with the workstation 41, as well as a printer 50 to hardcopy information or data from the computer 36 or plant computer network 39.

Those skilled in the art will recognize that the inventive arrangements can be realized in hardware, software, firmware, or any various combinations thereof. A representative visualization tool according to the inventive arrangements can be realized in a centralized fashion over one computer 36, or, alternatively, in a distributed fashion in which multiple elements and components are spread over multiple, interconnected computers 36. Moreover, any kind of computer 36, or other apparatus, adapted for carrying out the inventive arrangements described herein is suited. A typical combination of hardware and software, for example, could be a general purpose computer 36 with a computer program that, upon loading and execution, controls the computer 36 such that the described inventive arrangements are realized.

Thus, in a preferred embodiment, the computer 36 is an interface to an existing plant information system computer, which can function as a data historian for the tank house and operators thereof.

Figure 5:
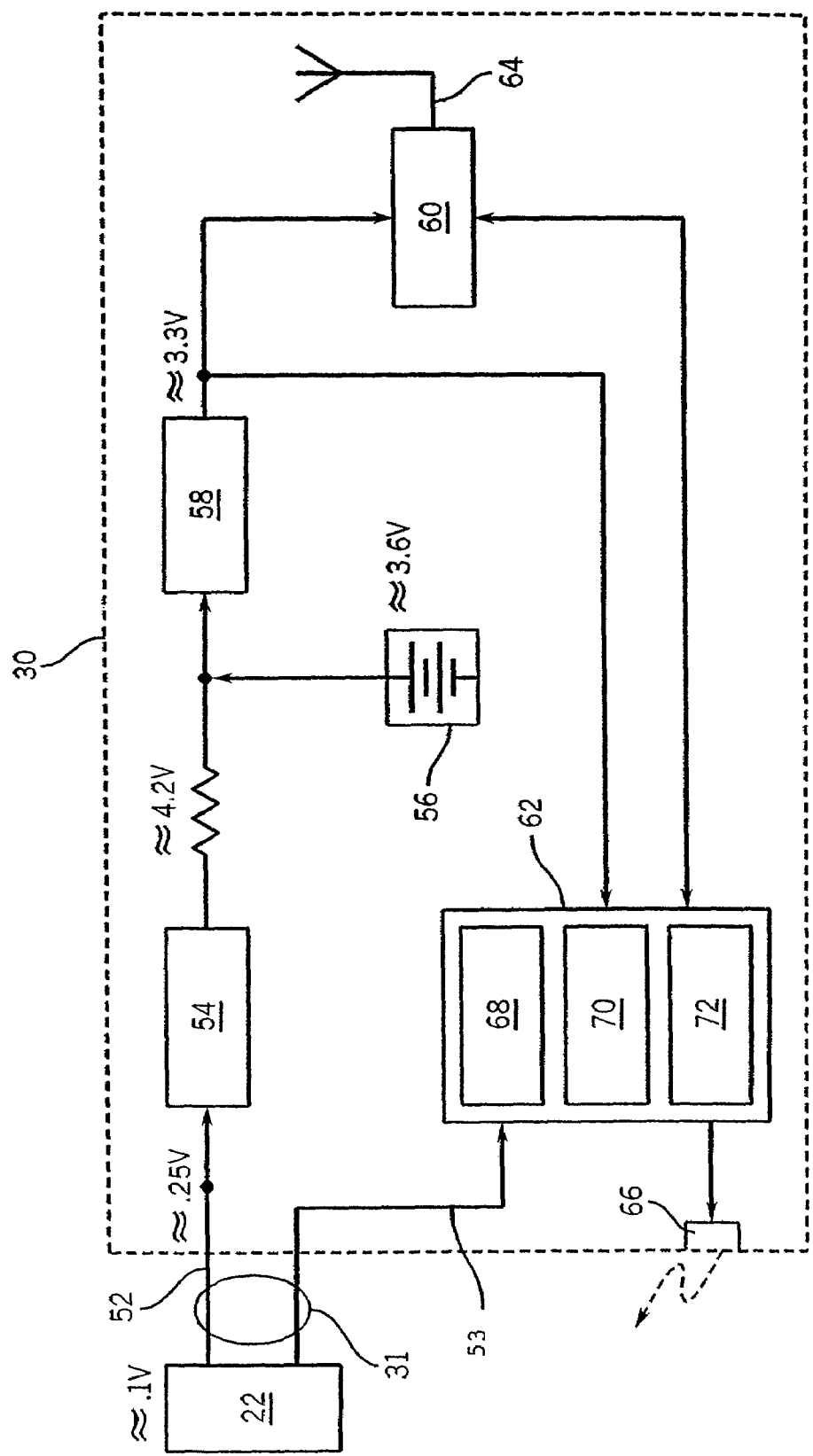
FIG. 5 is functional block diagram of a slave.

Referring now to FIG. 5, a functional block diagram of the slave 30 is shown. More specifically, at least two electrical connections 31 are provided between the electrolytic cell 22 and the slave 30. A first connection 52 utilizes the bus voltage, which is the voltage impressed across the anodes A and cathodes C, to power the slave 30. The cell voltage is also measured through this connection. A second connection 53 communicates with the various sensors that monitor the cell parameters that correspond to the physical properties of the electrolytic cell 22 to which the sensors are attached.

Typical cell voltages generally range between approximately 0.1-0.8 volts, and they are commonly between approximately 0.2-0.3 volts, and even more commonly, they are approximately 0.25 volts. This is generally insufficient to power the microprocessor-based slave 30, so a voltage booster 54 is provided, which will be elaborated upon below. The voltage booster 54 boosts the ultra-low cell voltages from the approximately less then 0.1 to approximately 5.0 volts. If insufficient voltage is available from the electrolytic cell 22 to power the voltage booster 54 (i.e., voltage greater than 0.15 volts may not always be available from the electrolytic cell 22), a re-chargeable battery 56 can also be provided as an energy reservoir, preferably at approximately 3.6 volts. Representative re-chargeable batteries 56 include a NiCad battery, a NIMH battery, a Lithium-Ion Battery, or the like. Preferably, the re-chargeable battery 56 is suitable for low current charge and high ambient working temperature. On the other hand, if sufficient voltage is available from the electrolytic cell 22 to power the microprocessor-based slave 30, it can be used directly, without the voltage booster 54 or re-chargeable battery 56. In other words, if sufficient voltage is available from the electrolytic cell 22 to feed the voltage booster 54 (i.e., greater than 0.15 volts), then the slave 30 can be powered by the voltage booster 54 drawing energy therefrom. The voltage booster 54 will also charge the re-chargeable battery 56 when the cell voltage is high enough (i.e., greater then 0.15 volts).

The re-chargeable battery 56 can be recharged in different fashions, including, for example: i) recharging the battery 56 whenever sufficient voltage is available from the electrolytic cell 22; or ii) recharging the battery 56 only when the battery voltage falls below a certain threshold level. In order to reduce the interference, it is preferable to shutdown the voltage booster 54 and power the slave 30 with the re-chargeable battery 56 while sampling the cell parameters and transmitting or receiving data through the wireless data transfer mechanisms of this invention.

In any event, through either the voltage from the voltage booster 54 or the voltage from the re-chargeable battery 56, a voltage regulator 58 provides a constant supply voltage of approximately 3.3 volts to the slave's 30 transceiver 60 and microprocessor 62.

As will be elaborated upon below, the transceiver 60 preferably communicates with the masters 32 through an antenna 64 using a Frequency Hopping Spread Spectrum ("FHSS") or Direct Sequence Spread Spectrum ("DSSS") over the Industrial, Scientific, and Medical ("ISM") Band. Preferably, the antenna 64 is internal to the slave 30 due to the hostile environment to which the slave 30 is exposed, but an external antenna 64 can also be provided if needed or desired.

In any event, the supply voltage from the voltage regulator 58 also powers the microprocessor 62, which contains an A/D converter 68 for converting analog signals from the electrolytic cell 22 to which the sensors are attached. The microprocessor 62 also contains protocol software 70 for controlling the slave 30 and a Proportional, Integrated, Derivative ("PID") controller or other algorithm 72 for the voltage booster 54.

Accordingly, the slave 30 generally performs at least one or more of the following functions: samples and converts electrolytic cell parameters to digital data; processes digital data using certain digital signal processing algorithms, such as digital filtering; transmits the digital data signals to the masters 32 through a wireless communications network 34 such as a wireless radio link; provides power to itself by boosting the ultra-low cell voltage, and uses a re-chargeable battery 56 for back-up power. In a preferred embodiment, it has the following specifications: uses the FHSS or DSSS over the ISM radio frequency band; utilizes a baud rate of 76.8 k bits/second or greater; has a transmitting and receiving range of approximately 200 feet or greater; three or more 10 bit A/D channels; an operating ambient temperature of approximately −10 to +85° Celsius or greater; a digital temperature sensor resolution of ±0.0615° C. or greater; and utilizes an LED output 66 to communicate cell data, such as cell voltage. Because it is microprocessor-based, the slave 30 can also be programmed to compress and filter the data signals prior to transmission to the masters 32, process data on-board and recognize deviations from pre-determined set-point thresholds, analyze the electrical connection quality between itself and the electrolytic cell 22, and implement the wireless protocol by which it communicates to the masters 32.

Figure 6:
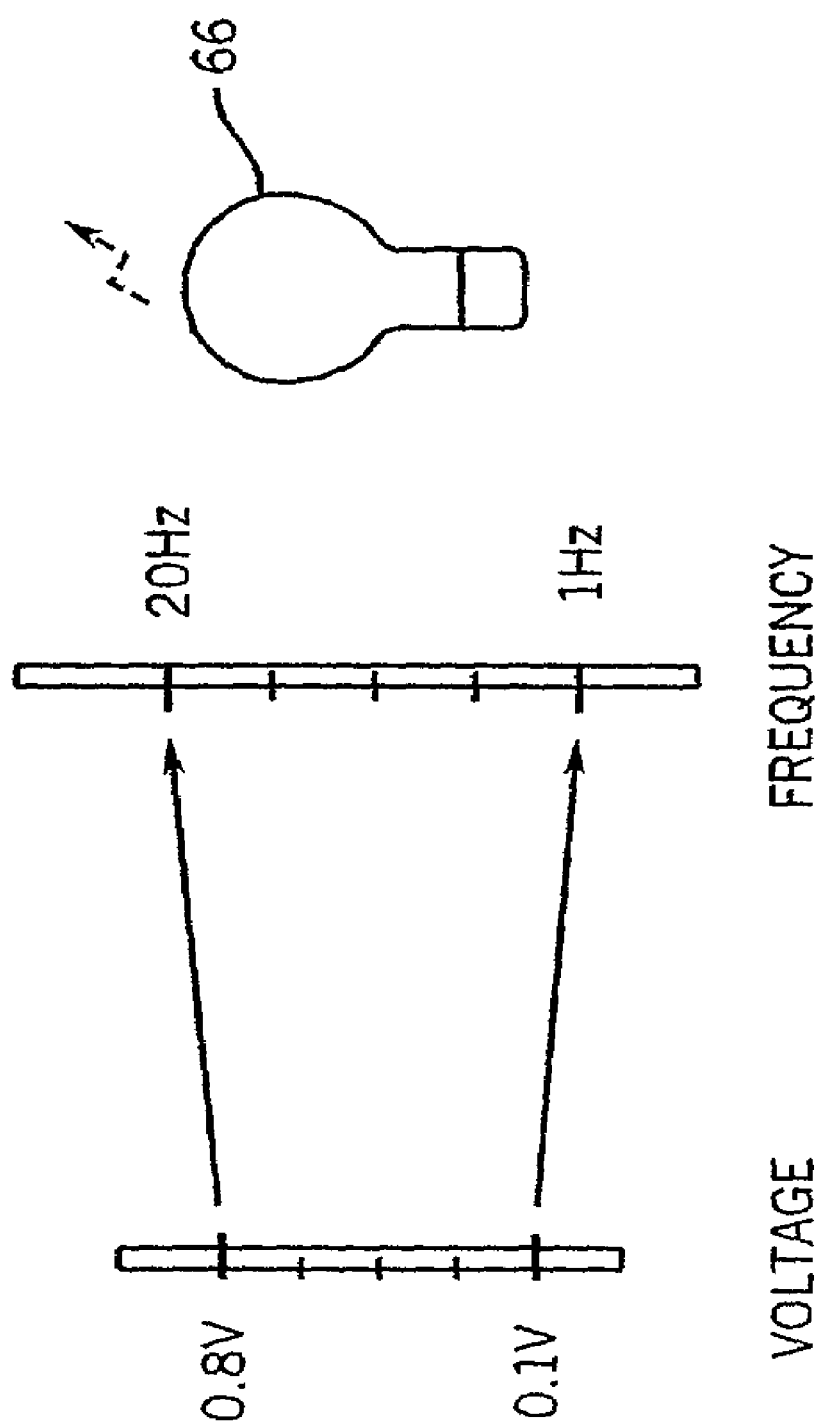
FIG. 6 is a visual representation of a preferred voltage to frequency mapping.

FIG. 6 depicts one preferred way for the LED output 66 of the slave 30 to communicate electrolytic cell 22 data. More specifically, cell voltage, which is an important cell parameter, is visually indicated to operators viewing the slave 30. For example, the cell voltage can be linearly converted to a LED flashing frequency so that a short circuit in an electrolytic cell 22 can be easily identified in the tank house by an operator visually comparing the flashing frequency of various LED outputs 66. In another preferred embodiment, multiple (i.e., four) LED outputs 66 can be utilized, with different colors representing different conditions of the slaves. These LED outputs 66 can be utilized for diagnostic purposes such as transmission monitoring and short circuit identification. In another preferred embodiment, audible outputs are also provided to communicate cell data. These types of indicators permit operators to focus efforts away from a large population of electrolytic cells 22 and focus on such electrolytic cells 22 that need more immediate attention.

Figure 7:
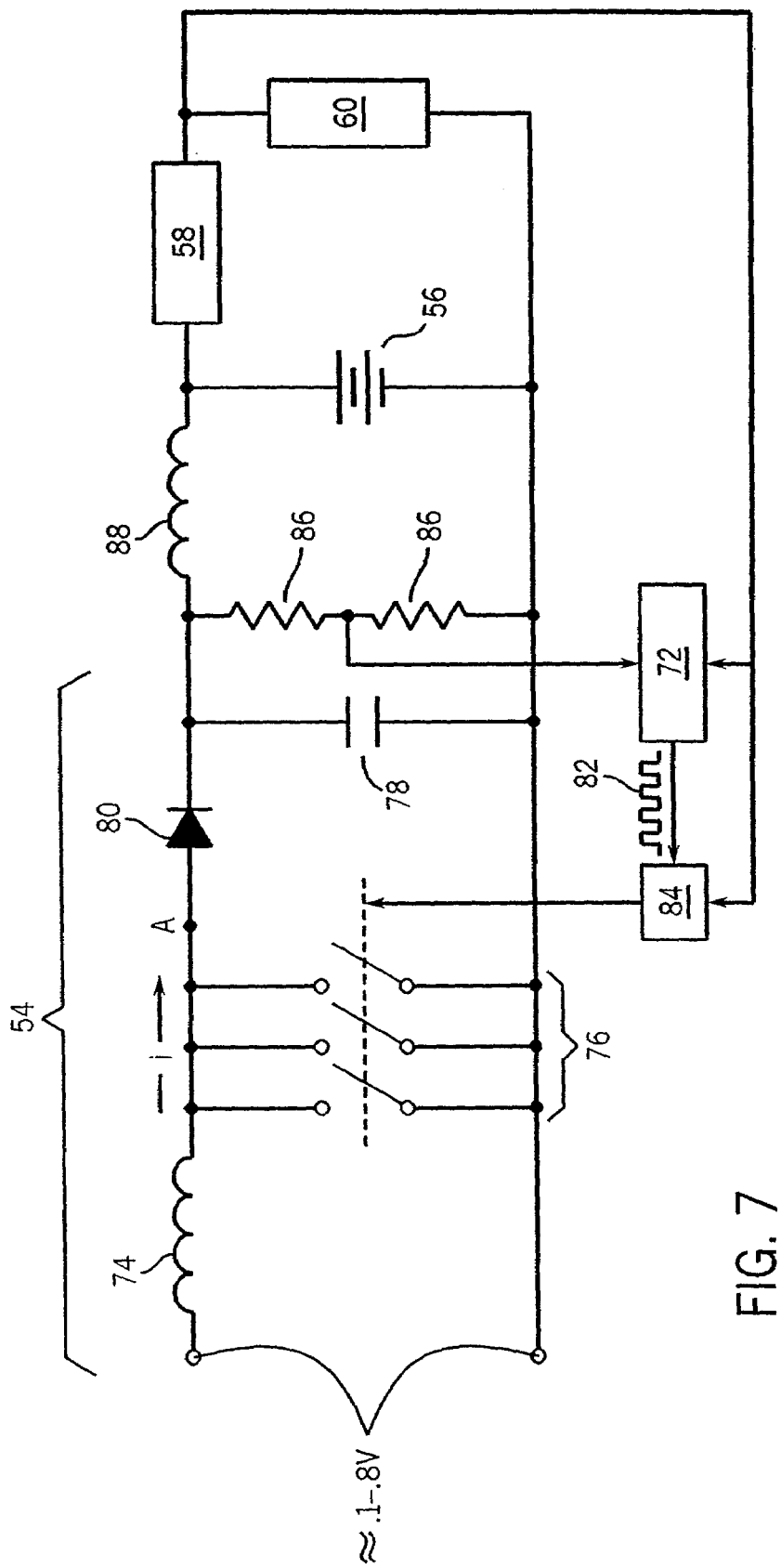
FIG. 7 is a preferred voltage boosting circuit.

Referring now to FIG. 7, the voltage booster 54 of FIG. 5 will be elaborated upon, which is provided to boost the ultra-low cell voltages from the approximately less than 0.1 volts to a sufficient voltage to power the slave 30 and recharge the re-chargeable battery 56. More specifically, a first inductor 74 converts electrical energy into magnetic field energy when a switching array 76—which contains minimal resistance and low gate capacitance, and, preferably, one or more suitable MOSFET devices—is closed. When the switching array 76 is opened, the magnetic field energy stored in the first inductor 74 generates a high voltage at node A in order to keep the current i constant. This high voltage charges a capacitor 78 through a diode 80. The amount of charge the capacitor 78 receives depends, in part, on the ON-OFF duty cycle of the switching array 76, which is controlled by the PID controller or other algorithm 72 of the microprocessor 62. Accordingly, the booster output voltage is regulated by altering a pulse width modulation ("PWM") duty cycle 82, which is controlled by the PID controller or other algorithm 72 of the microprocessor 62 operating through a low-power consuming driver 84 known to those skilled in the art. In addition, PWM frequency is preferably higher than 50 kHz.

Through a 3.3 volts voltage regulator 58, the re-chargeable battery 56 is used both as an initial energy source for the slave 30 as well as a reservoir. Thus, the re-chargeable battery 56 powers the slave 30 when the slave 30 is initially turned on, as well as when the ultra-low cell voltage is unavailable or insufficient to power the slave 30. However, whenever the ultra-low cell voltage is available and sufficient to feed the voltage booster 54, the voltage booster 54 can be turned on and it will power the slave 30 and charges the re-chargeable batter 56. In a preferred embodiment, a battery voltage can be sampled periodically and the data communicated as diagnostic information to indicate the useful life of the re-chargeable battery 56.

In order to draw sufficient power from this ultra-low cell voltage, the current i must be high. Thus, the voltage booster 54 preferably operates with minimal resistance, and the first inductor 74 and switching array 76 are suitably chosen with low resistances. Preferably, for example, the total resistance of the first inductor 74 and switching array 76 should be less than 20 m ohms.

As explained, the digital PID device 72, preferably built into the microprocessor 62, regulates the output of the voltage booster 54. Because a second inductor 88 has a preferred DC resistance of approximately 2.3 ohms, the microprocessor 62 can control the charging current by controlling the voltage drop across the inductor 88. The voltage across the inductor 88 is the difference of the output voltage of the voltage booster 54 and the voltage of the battery 56. Preferably, both voltages are sampled by an A/D channel of the microprocessor 72 through the voltage divider 86. The voltage sampled is the output voltage of the voltage booster 54 when the voltage booster 54 is turned on, and it will be voltage of the battery 56 when the voltage booster 54 is turned off. The booster output voltage can be altered by altering a set-point of the PID controller or other algorithm 72. In alternative embodiments, different charge strategies can be applied for different types of re-chargeable batteries 56.

Preferably, the second inductor 88 can be a low pass filter inductor, which can advantageously remove high frequency contaminants of the voltage booster 54.

Figure 8:
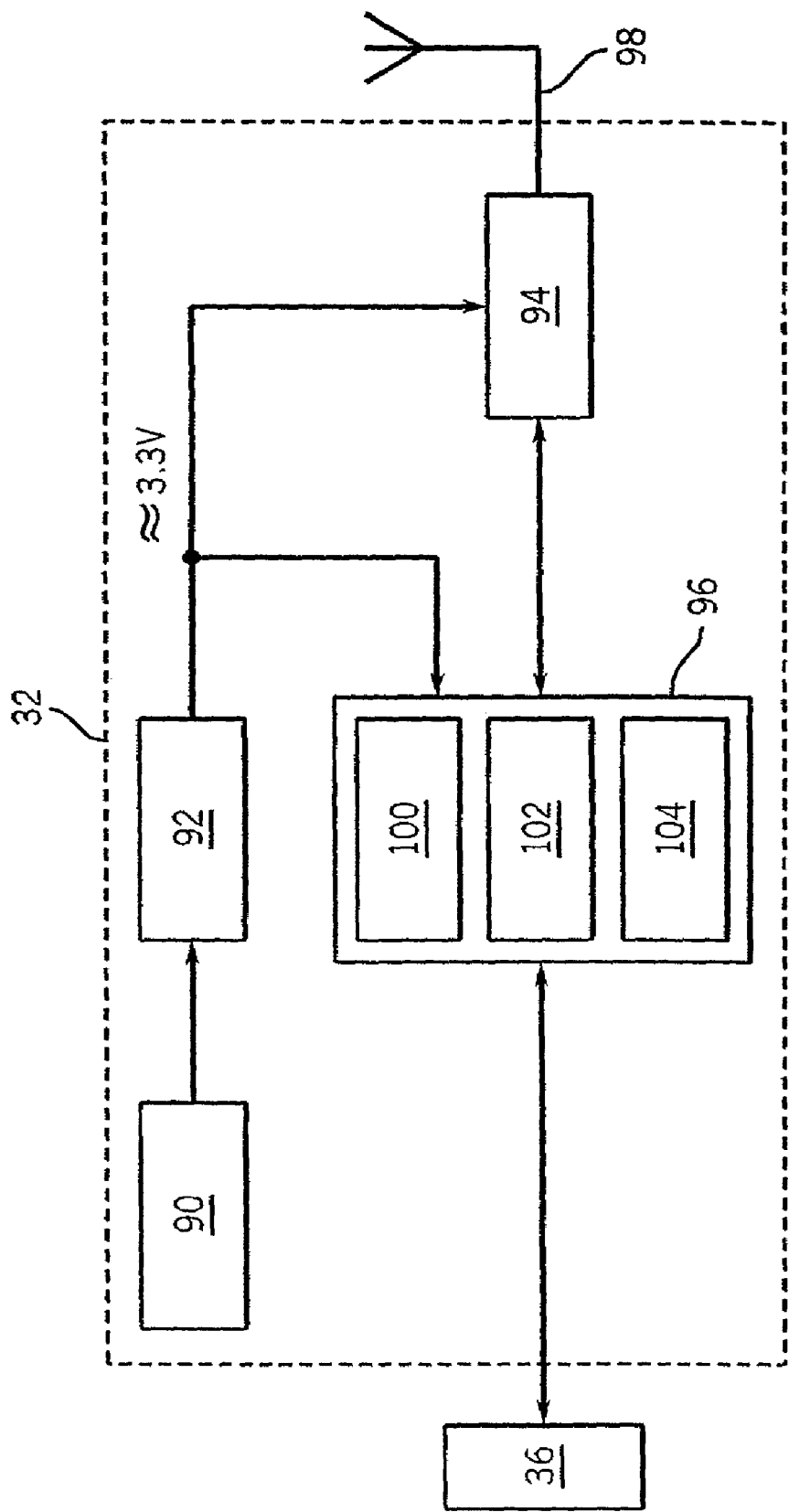
FIG. 8 is functional block diagram of a master.

Referring now to FIG. 8, a functional block diagram of the master 32 is shown. As previously mentioned, the slaves 30 and masters 32 are preferably formed from the same hardware, with different functionality enabled depending on the application. In any event, the master 32 receives a regulated/unregulated 5-9 volts DC from a conventional 110 volt AC power adaptor 90 and feeds to a voltage regulator 92 to provide a constant supply voltage of 3.3 volts to the master's 32 transceiver 94 and microprocessor 96. As will be elaborated upon below, the transceiver 94 preferably communicates with the slaves 30 through an antenna 98 using the FHSS of DSSS over the ISM Band. The antenna 98 is preferably external to the master 32 to increase transmission and reception sensitivities, but an internal antenna 98 can also be provided if needed or desired. And the microprocessor 96 contains a Universal Asynchronous Receiver Transmitter ("UART") 100, which is a standard serial communication port built thereinto. The microprocessor 96 also contains protocol software 102 for controlling the master 32 and an input/output port 104 for communicating with the computer 36.

Accordingly, the master 32 generally performs at least one or more of the following functions: receives digital data signals from the slaves 30 through a wireless communications network 34 and transmits the data signals to the computer 36 either directly or through a data relay 40 and central master 42, depending on the preferred configuration. In a preferred embodiment, it has the following specifications: uses the FHSS or DSSS over the ISM radio frequency band; has a transmitting and receiving range of approximately 200 feet or greater; an operating temperature of approximately −10 to +85° Celsius or greater; powered by main 110 volts AC, and a maximum power consumption of less than 250 m Watts.

Referring now to FIGS. 9-12, a preferred communications protocol is depicted using FHSS communication technologies.

Figure 9:
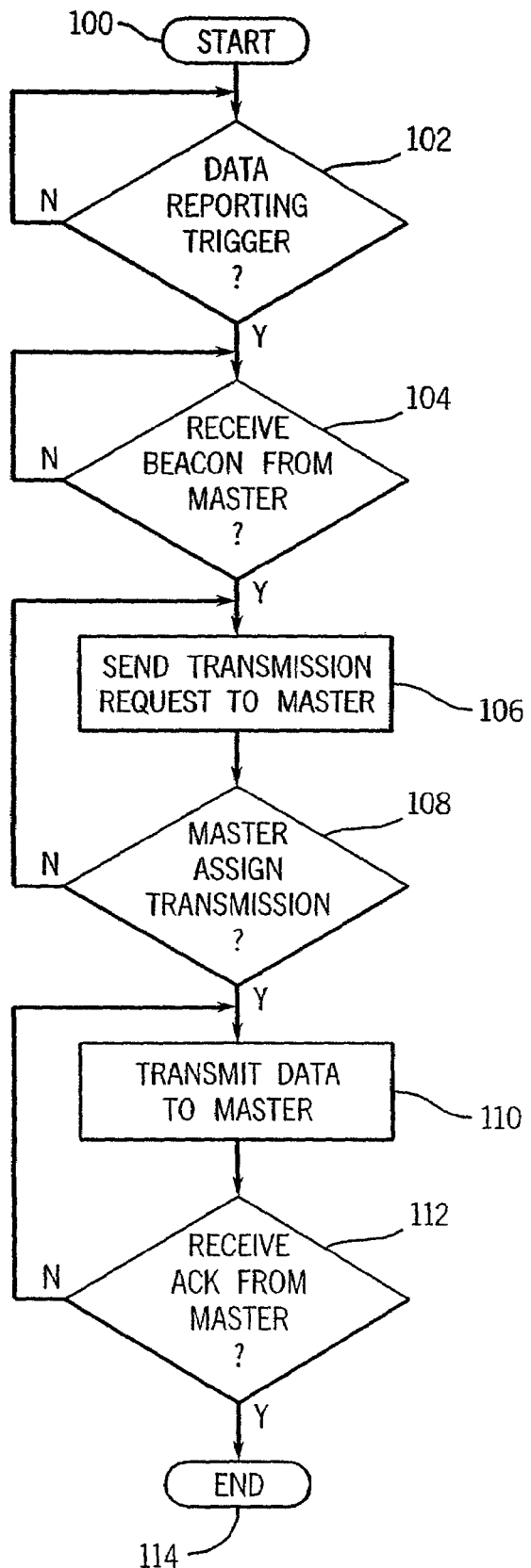
FIG. 9 is a flow chart of preferred operation of a slave.

For example, in preferred operation of a slave 30 depicted in FIG. 9, control begins in step 100, after which control passes to step 102.

In step 102, the slave 30 awaits a data reporting trigger, which can be activated by i) a deviation of a cell parameter measured since a last report exceeding a predefined threshold amount or dead-band, or ii) the time since the last report exceeding a predefined maximum reporting threshold period. If the slave 30 receives a data reporting trigger in step 102, control then passes from step 102 to step 104; otherwise, control remains at step 102 to await a data reporting trigger.

In step 104, the slave 30 awaits a beacon from a master 32. If the slave 30 receives a beacon from the master 32 in step 104, control then passes from 104 to step 106; otherwise, control remains at step 104 to await a beacon from the master 32.

In step 106, the slave 30 sends a transmission request to the master 32, after which control then passes to step 108.

In step 108, the slave 30 waits for the master 32 to assign the slave 30 to transmit the data to the master 108. If the master 32 assigns the slave 30 to transmit the data in step 108, control then passes from step 108 to step 110; otherwise, control then passes from step 108 to step 106.

In step 110, the slave 30 transmits the data to the master 32, after which control then passes to step 112.

In step 112, the slave 30 awaits acknowledgment from the master 32 that the master 32 received the data from the slave 30. If the slave 30 receives acknowledgment from the master 32 that the master 32 received the data from the slave 30 in step 112, control then passes from step 112 to step 114, by which the present operation concludes; otherwise, control then passes from step 112 to step 110.

Figure 10:
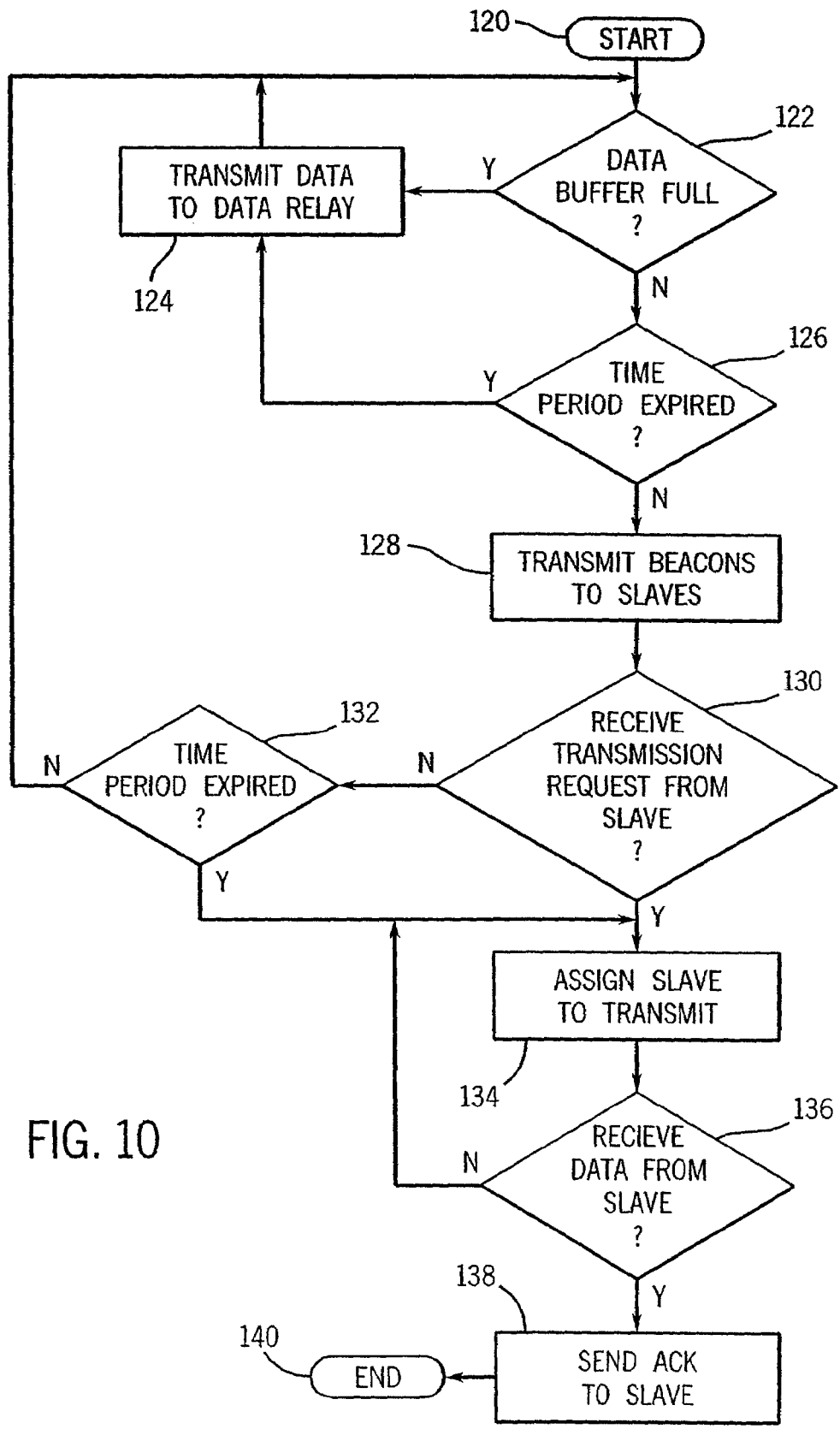
FIG. 10 is a flow chart of preferred operation of a master.

Likewise, in preferred operation of a master 32 depicted in FIG. 10, control begins in step 120, after which control passes to step 122.

In step 122, the master 32 waits for its data buffer to be full. If the master's 32 data buffer is full in step 122, control then passes from step 122 to step 124; otherwise, control then passes from step 122 to step 126.

In step 124, the master 32 transmits its data to a data relay 40, after which control then passes from step 124 back to step 122 to await the next full data buffer.

In step 126, the master 32 waits for a time out period to expire. If the time out period has expired in step 126, control then passes from step 126 to step 124; otherwise, control then passes from step 126 to step 128.

In step 128, the master 32 transmits beacon signals to the slaves 30, after which control then passes from step 128 to step 130.

In step 130, the master 32 awaits a transmission request from a slave 30. If the master 32 does not receive a transmission request from a slave 30 in step 130, control then passes from step 130 to step 132; otherwise, control then passes from step 130 to step 134.

In step 132, the master 32 waits for a time out period to expire. If the time out period has expired in step 132, control then passes from step 132 to step 134; otherwise, control then passes from step 132 to step 122.

In step 134, the master 32 assigns the slave 30 to transmit its data, after which control then passes to step 136.

In step 136, the master 32 awaits data from the slave 30. If the master 32 receives data from the slave 30 in step 136, control then passes from step 136 to step 138; otherwise, control then passes from step 136 to step 134.

In step 138, the master 32 sends an acknowledgment signal back to the slave 30, after which control then passes from step 138 to step 140, by which the present operation concludes.

Figure 11:
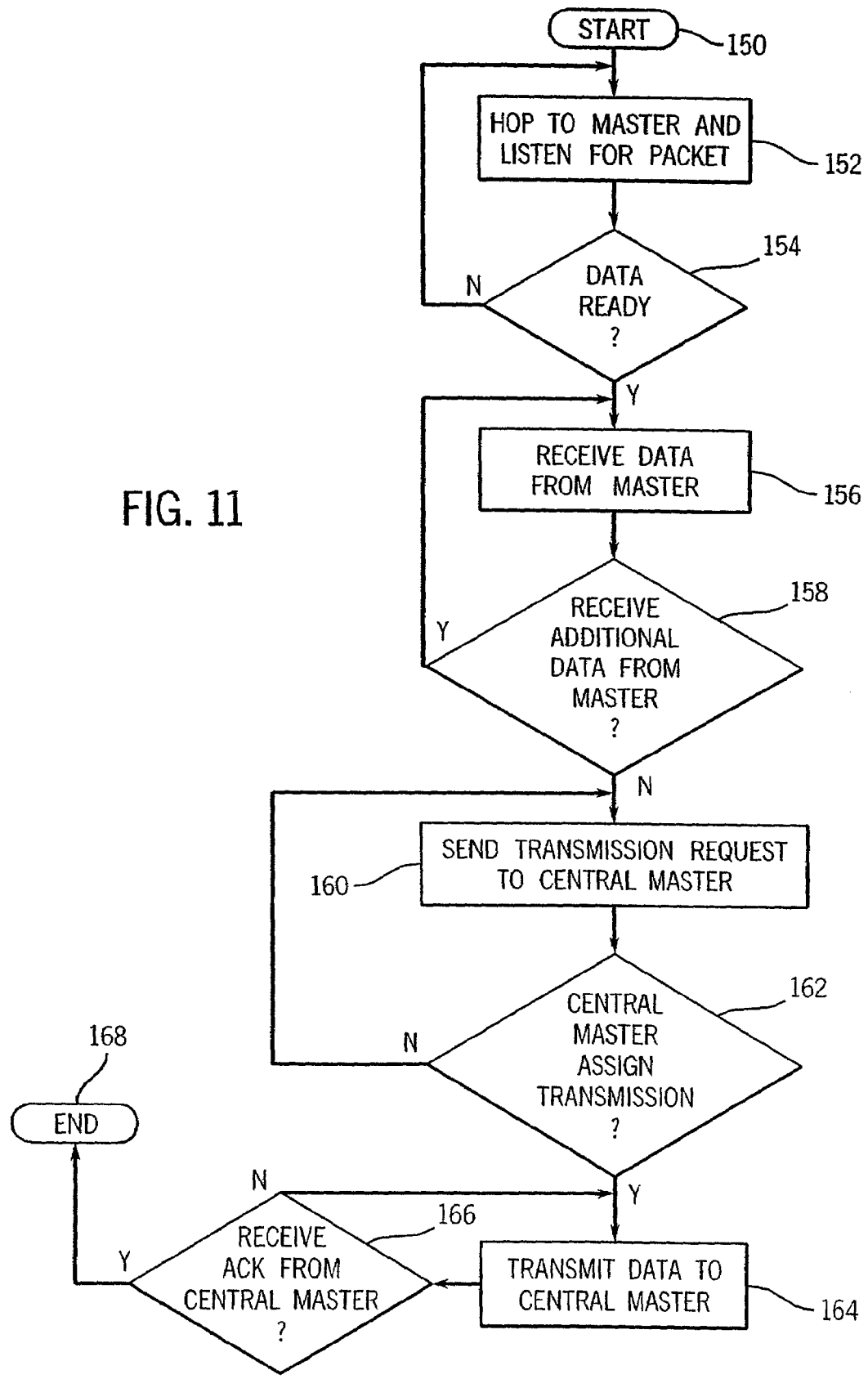
FIG. 11 is a flow chart of preferred operation of a data relay.

Likewise, in preferred operation of a data relay 40 depicted in FIG. 11, control begins in step 150, after which control passes to step 152.

In step 152, the data relay 40 waits for a data pack from the master 32, after which control then passes from step 152 to step 154.

In step 154, the data relay 40 waits for the data to be ready. If the data is ready in step 154, control then passes from step 154 to step 156; otherwise, control then passes from step 154 to step 152.

In step 156, the data relay 40 receives the data from the master 32, after which control then passes from step 156 to step 158.

In step 158, the data relay 40 awaits additional data from the master 32. If the data relay receives additional data from the master 32 in step 158, control then passes from step 158 to step 156; otherwise, control then passes from step 158 to step 160.

In step 160, the data relay 40 sends a transmission request to a central master 42, after which control then passes from step 160 to step 162.

In step 162, the data relay 40 awaits for the central master 42 to assign transmission. If the central master 42 assigns transmission to the data relay 40 in step 162, control then passes from step 162 to step 164; otherwise, control then passes from step 162 to step 160.

In step 164, the data relay 40 transmits data to the central master 42, after which control then passes to step 166.

In step 166, the data relay 40 awaits acknowledgment from the central master 42 that the central master 42 received the data from the data relay 40. If the data relay 40 receives acknowledgment from the central master 42 that the central master 42 received the data from the data relay 40 in step 166, control then passes from step 166 to step 168, by which the present operation concludes; otherwise, control then passes from step 166 to step 164.

Figure 12:
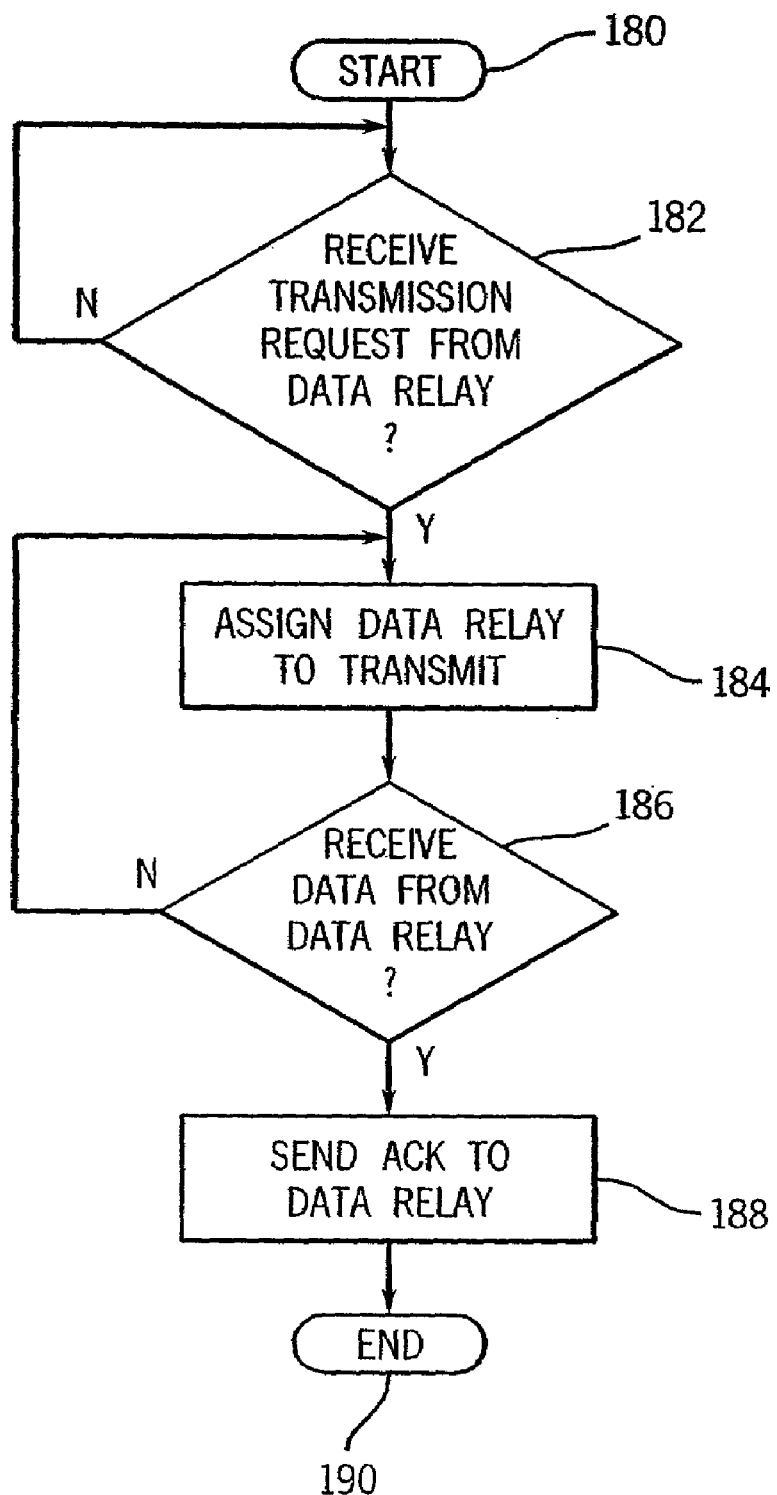
FIG. 12 is a flow chart of preferred operation of a central master.

Finally, in preferred operation of a central master 42 depicted in FIG. 12, control begins in step 180, after which control passes to step 182.

In step 182, the central master 42 awaits a transmission request from the data relay 40. If the central master 42 receives the transmission request from the data relay 40 in step 182, control then passes from step 182 to step 184; otherwise, control remains at step 182 to await a transmission request from the data relay 40.

In step 184, the central master 42 assigns the data relay 40 to transmit its data, after which control then passes from step 184 to step 186.

In step 186, the central master 42 awaits data from the data relay 40. If the central master 42 receives data from the data relay 40 in step 186, control then passes from step 186 to step 188; otherwise, control then passes from step 186 to step 184.

In step 188, the central master 42 sends an acknowledgment back to the data relay 40, after which control then passes from step 188 to step 190, by which the present operation concludes.

As described, spread spectrum communication technologies, such as FHSS, use wide band, noise-like signals that make them difficult to detect, intercept, demodulate, jam, or otherwise interfere with, particularly compared to narrow band signals.

Several various spread spectrum transmission techniques exist, including Direct Sequence Spread Spectrum ("DSSS"), Frequency Hoping Spread Spectrum ("FHSS") (as described hereinout for exemplary, representative, and non-limiting purposes), Time Hopping Spread Spectrum ("THSS"), and Code Division Multiple Access ("CDMA").

With DSSS, a data signal at the sending station is combined with a higher data rate bit sequence, or chipping code, that divides the user data according to a spreading ratio. The chipping code is a redundant bit pattern for each bit that is transmitted, and it increases the signal's resistance to interference. If one or more bits in the pattern are damaged during transmission, then the original data can be recovered due to the redundancy of the transmission. Such bit-sequences have properties of spectral flatness and low cross and auto-correlation values (i.e., they are like true noise in this respect), and therefore complicate jamming or detection by non-target receivers.

With FHSS, the carrier frequency shifts or "hops" according to its unique, random sequence. With this technique, the number of discrete frequencies determine the bandwidth of the system.

The typical FHSS device is a pseudo-noise code-controlled frequency synthesizer. Instantaneous frequency output of the device jumps from one value to another based on the pseudo-random sequence. Varying the instantaneous frequency results in an output spectrum that is effectively spread over the range of frequencies generated. A synchronized pseudo noise code generator that drives the receiver's local oscillator frequency synthesizer performs de-hopping in the receiver. Accordingly, FHSS uses a frequency synthesizer that can rapidly hop over a set of carrier frequencies.

The Federal Communication Commission ("FCC") permits unlicensed operation in portions of the frequently spectrum called the Industrial, Scientific, and Medical ("ISM") Bands, provided that certain technical restrictions on transmitter power and modulation are met. The most well-known ISM band is the 902-928 MHz band in the U.S. (commonly called the 915 MHz band) and the 2.4-2.4835 GHz band worldwide.

As described above, these technologies can be readily implemented in the inventive arrangements by techniques known in the art. However, the inventive arrangements are not intended to be limited in this regard. For example, while spread spectrum technologies, including FHSS and DSSS, are preferred, narrow band communications can also be used. Likewise, portions of the frequency spectrum other than the ISM band can also be used.

Accordingly, it should be readily apparent that this specification describes exemplary, representative, and non-limiting embodiments of the inventive arrangements. Accordingly, the scope of this invention is not limited to any of these embodiments. Rather, the details and features of these embodiments were disclosed as required. Thus, many changes and modifications—as apparent to those skilled in the art—are within the scope of the invention without departing from the scope hereof, and the inventive arrangements are necessarily inclusive thereof. Accordingly, to apprise the public of the spirit and scope of this invention, the following claims are made:

What is claimed is:

1. An electrolytic cell monitoring system, comprising:
   a first electronic device electrically attached to current rails of the electrolytic cell, and powered using electrical potential imposed across current rails of the electrolytic cell, the first electronic device in communication with one or more sensors that monitor respective one or more properties of the electrolytic cell, and
   a second electronic device in wireless communication with said first electronic device for receiving data signals from said first electronic device, said first electronic device and said second electronic device being physically remote from one another.

2. The system of claim 1, wherein said first electronic device transmits said data signals to said second electronic device.

3. The system of claim 1, wherein said first electronic device and said second electronic device communicate over a wireless personal area network.

4. The system of claim 1, wherein said first electronic device and said second electronic device communicate over a low rate wireless network.

5. The system of claim 1, wherein said first electronic device and said second electronic device communicate using a spread spectrum wireless network.

6. The system of claim 1, further comprising:
   a computer in communication with said second electronic device, wherein said second electronic device transmits said data signals to said computer for further processing of said data signals.

7. The system of claim 1, wherein said first electronic device includes a battery to power said first electronic device when said electrical potential imposed across current rails of the electrolytic cell is insufficient to power said first electronic device.

8. The system of claim 1, wherein said first electronic device includes a voltage booster which is operable to boost the electrical potential imposed across current rails of the electrolytic cell to provide a voltage level sufficient to power said first electronic device.

9. The system of claim 1, wherein said one or more sensors are selected from a group consisting of a voltage sensor, temperature sensor, turbidity sensor, and composition sensor.

10. An electrolytic cell monitoring device, comprising:
    an electronic component electrically attached to current rails of the electrolytic cell and in communication with one or more sensors that monitor respective one or more properties of the electrolytic cell, wherein said electronic component is powered using electrical potential imposed across current rails of the electrolytic cell.

11. The device of claim 10, wherein said device includes a battery to power said device when said electrical potential imposed across the current rails of the electrolytic cell is insufficient to power said device.

12. The device of claim 10, wherein said device includes a voltage booster which is operable to boost the electrical potential imposed across the current rails of the electrolytic cell to provide a voltage level sufficient to power said device.

13. A method for monitoring an electrolytic cell, comprising:
    providing a first electronic device electrically attached to current rails of the electrolytic cell and in communication with one or more sensors in the electrolytic cell;
    powering said first electronic device using electrical potential imposed across current rails of the electrolytic cell;
    monitoring with the one or more sensors respective one or more properties of the electrolytic cell; and
    wirelessly transmitting data signals from said first electronic device to a second electronic device, said first electronic device and said second electronic device being physically remote from one another.

14. The method of claim 13, wherein said first electronic device and said second electronic device communicate over a wireless personal area network.

15. The method of claim 13, wherein said first electronic device and said second electronic device communicate over a low rate wireless network.

16. The method of claim 13, wherein said first electronic device and said second electronic device communicate using a spread spectrum network.

17. The method of claim 13, further comprising:
    powering said first electronic device using a battery when said electrical potential imposed across current rails of the electrolytic cell is insufficient to power said first electronic device.

18. The method of claim 17 wherein the battery is a rechargeable battery, the method comprising recharging the rechargeable battery with the electrical potential.

19. The method of claim 13, further comprising:
    boosting said electrical potential imposed across current rails of the electrolytic cell to provide a voltage level sufficient to power said first electronic device.

20. A method for producing high-purity copper, comprising:
    treating feed material to form therefrom one or more anodes comprising copper contaminated with one or more non-copper impurities;
    electrolytically refining said anodes in one or more electrolytic cells comprising an aqueous sulfuric acid electrolyte, into which said anodes and also cathodes are immersed, said refining comprising establishing a voltage between said anodes and said cathodes of sufficient electrical potential to dissolve copper from said anodes and deposit high-purity copper onto said cathodes;

providing an electronic device electrically attached to the anodes and the cathodes and in communication with one or more sensors sampling the sensors;

sampling the one or more sensors monitoring cell parameters corresponding to physical properties of said cell to which said sensors are attached to generate one or more data signals, said data signals corresponding to said parameters;

powering the electronic device with the electrical potential between the anodes and the cathodes; and wirelessly transmitting said data signals to a remote electronic device.

* * * * *